US009449142B2

(12) United States Patent
Cummings et al.

(10) Patent No.: US 9,449,142 B2
(45) Date of Patent: Sep. 20, 2016

(54) SYSTEM AND METHOD FOR MODELING SUPERVISORY CONTROL OF HETEROGENEOUS UNMANNED VEHICLES THROUGH DISCRETE EVENT SIMULATION

(75) Inventors: Mary Louise Cummings, Cambridge, MA (US); Carl Elie Nehme, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1153 days.

(21) Appl. No.: 12/400,454

(22) Filed: Mar. 9, 2009

(65) Prior Publication Data

US 2010/0228533 A1 Sep. 9, 2010

(51) Int. Cl.
| | |
|---|---|
| *G06F 17/50* | (2006.01) |
| *B60W 40/02* | (2006.01) |
| *B60W 40/08* | (2012.01) |
| *B60W 40/10* | (2012.01) |
| *G09B 9/00* | (2006.01) |
| *G09B 19/00* | (2006.01) |

(52) U.S. Cl.
CPC ....... *G06F 17/5095* (2013.01); *G06F 17/5009* (2013.01); *G09B 9/003* (2013.01); *G09B 19/00* (2013.01); *B60W 40/02* (2013.01); *B60W 40/08* (2013.01); *B60W 40/10* (2013.01)

(58) Field of Classification Search
CPC .............. G06F 17/5009; G06F 17/50; G06F 17/5095; B60W 40/02; B60W 40/08; B60W 40/10; G05B 17/00; G05B 13/047; G05B 2219/40309; G09B 19/00
USPC ........................................... 703/17, 2, 8, 23
See application file for complete search history.

(56) References Cited

U.S. PATENT DOCUMENTS

| | | | |
|---|---|---|---|
| 5,555,495 A | * | 9/1996 | Bell ...................... B60W 40/08 180/907 |
| 2004/0038185 A1 | | 2/2004 | Ball et al. |
| 2006/0146053 A1 | * | 7/2006 | Gatewood et al. ........... 345/440 |
| 2006/0184292 A1 | | 8/2006 | Appleby et al. |
| 2007/0067050 A1 | * | 3/2007 | Fregene et al. ................. 700/31 |
| 2008/0027590 A1 | | 1/2008 | Phillips et al. |
| 2008/0195281 A1 | | 8/2008 | Norris et al. |
| 2011/0060557 A1 | * | 3/2011 | De Pasca ............ G06F 17/5009 703/1 |
| 2014/0195214 A1 | * | 7/2014 | Kozloski ............. G06F 17/5009 703/8 |

OTHER PUBLICATIONS

Mary L. Cummings, "Predicting Controller Capacity in Supervisory control of Multiple UAVs", Mar. 3, 2008.*

(Continued)

*Primary Examiner* — Akash Saxena
(74) *Attorney, Agent, or Firm* — Peter A. Nieves; Sheehan Phinney Bass & Green, PA

(57) ABSTRACT

A system and method for modeling supervisory control of heterogeneous unmanned vehicles through discrete event simulation is provided. Generally, the system contains a memory and a processor configured by the memory to perform the steps of: simulating events in the system; simulating arrival processes for the events in the system; simulating how long a human operator takes to respond to the simulated events in the system, where the time that the human operator takes to respond to a simulated event is referred to as a service time; and prioritizing the events to be handled by the human operator, wherein the system models human operator involvement in the unmanned vehicle system.

19 Claims, 7 Drawing Sheets

(56) References Cited

OTHER PUBLICATIONS

M. L. Cummings, "Predicting Operator Capacity for Supervisory Control of Multiple UAVs", 2007.*
Jacob W. Crandall, NPL, "Identifying Predictive Metrics for Supervisory Control of Multiple Robots", IEEE, Oct. 2007.*
Carl Nehme, NPL, "The Impact of Heterogeneity on Operator Performance in future Unmmaned Vehicle systems", Nov. 21, 2008 (google).*
Wayback Machine archieval retrieval dated Jan. 31, 2009, pp. 1-3, including original web page (http://www.dodccrp.org/html4/journal_v2n2.html) and the archieval page for webpage (https://web.archive.org/web/20090131060921/http://dodccrp.org/html4/journal_v2n2.html).*
"The Impact of Heterogeneity on Operator Performance in Future Unmanned Vehicle Systems", Carle Nehme et al., The International C2 Journal, vol. 2, No. 2, 2008, 30 pages.
"Predicting the Impact of Heterogeneity on Unmanned-Vehicle Team Performance", Carl Nehme, et al., 5 pages, Sep. 2008.
"A Queueing Model of Pilot Decisionmaking in a Multitask Flight Management Situtation", Walden, Rex S. et al., IEEE Transactions on Systems, Man, and Cybernetics, vol., SMC-8, No. 12, Dec. 1978.
"Queueing Network Modeling of Human Performance of Concurrent Spatial and Verbal Tasks", Liu, Yili, IEEE Transactions on Systems, Man, and Cybernetics—Part A: Systems and Humans, vol. 27, No. 2, Mar. 1997.
"Fan-Out: Measuring Human Control of Multiple Robots", Olsen, D.R., et al., 2004. In SIGCHI conference on Human factors in Computing systems. Vienna, Austria.
"A Queuing Analysis of the Air Traffic Controller's Work Load", Schmidt, D.K., 1978. IEEE Transactions on Systems, Man, and Cybernetics 8(6):492-498.

* cited by examiner

SYSTEM AND METHOD FOR MODELING SUPERVISORY CONTROL OF HETEROGENEOUS UNMANNED VEHICLES THROUGH DISCRETE EVENT SIMULATION

GOVERNMENT SUPPORT

This invention was supported, in whole or in part, by Grant Number N00014-06-C-0414, from the Office of Navy Research. The United States Government has certain rights in this invention.

FIELD OF THE INVENTION

The present invention is generally related to computer simulation, and more particularly is related to a queuing-based multiple unmanned vehicle discrete event simulation modeling system and method.

BACKGROUND OF THE INVENTION

Operator supervisory control of unmanned-vehicle (UV) teams has become a major area of research and development due to advancements in technology seeking to relieve human operators of low-level tasking and a focus on network-centric operations, which requires higher levels of human reasoning and judgment.

Complex problems similar to those that present themselves through concepts such as network-centric operations and future combat systems require a transition from the architecture of today, where vehicles are supervised on an individual basis, to an architecture where operators integrate information retrieved from multiple platforms. Allowing for systems where multiple vehicles can be supervised by a single operator simultaneously facilitates such operational architectures.

Increasing use of automation in unmanned vehicle systems has shifted human operator responsibility from manually controlling vehicles to managing vehicles at the supervisory control level. At the supervisory control level, implementation details of higher-level tasking initiated by the human are delegated to the automation onboard these vehicles. The reduced workload afforded by supervisory control has several implications. One such implication is an increase in operator idle time, which can be used as a force multiplier that allows operators to supervise multiple vehicles simultaneously, hence inverting the current many-to-one ratio of operators to vehicles.

There are several driving forces, such as network centric operations and the associated widely diverse set of mission possibilities that require interoperability among UVs of varying attributes. Therefore, heterogeneity in vehicle capabilities and tasks is likely to exist in future UV systems. This will lead to a large design space for these systems, which will cause design validation to require lengthy and expensive human-in-the-loop experimentation.

To maximize UV control capabilities, it is desirable to determine a number of unmanned vehicles that can be controlled by a single human controller. Unfortunately, the process of performing experimentation to determine a number of unmanned vehicles that can be controlled by a single user can be very costly due to items such as, but not limited to, setup costs and personnel required. In addition, different human controllers may have different control capabilities, thereby requiring many experiments with different human controllers, which again adds to design validation expense.

In determining human-UV performance, it is important to note that operator situational awareness can significantly influence human behavior and hence, human-UV system performance. A lack of situational awareness on the part of the operator results in increased time for the operator to notice the needs of the system, which then results in increased wait times for the system. Thus, one negative side effect of low situational awareness is additional vehicle wait times due to loss of situational awareness. It has been shown that wait times due to loss of situational awareness can account for the largest part of vehicle wait time, and significantly reduces the overall number of vehicles that a single operator can control.

Therefore, it is desirable to determine a maximum number of heterogeneous unmanned vehicles that can be controlled by a user in an efficient and inexpensive manner, while capturing the effects of wait times due to loss of situational awareness. In addition, it is desirable to determine the efficiency of human-UV interaction at different vehicle team sizes, as well as at different settings for other system variables, such as, level of autonomy and level of heterogeneity of the vehicle team.

SUMMARY OF THE INVENTION

Embodiments of the present invention provide a system and method for modeling supervisory control of heterogeneous unmanned vehicles through discrete event simulation. Briefly described, in architecture, one embodiment of the system, among others, can be implemented as follows. The system contains a memory and a processor configured by the memory to perform the steps of: simulating events in the system; simulating arrival processes for the events in the system; simulating how long a human operator takes to respond to the simulated events in the system, where the time that the human operator takes to respond to a simulated event is referred to as a service time; and prioritizing the events to be handled by the human operator, wherein the system models human operator involvement in the unmanned vehicle system.

Other systems, methods, and features of the present invention will be or become apparent to one with skill in the art upon examination of the following drawings and detailed description. It is intended that all such additional systems, methods, and features be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

The present modeling system and method provides a queuing-based multi-UV discrete event simulation (MUV-DES) model that assists designers of heterogeneous unmanned vehicle systems understand the impact of design decisions on the effectiveness of operator supervision of the unmanned vehicles. The modeling system and method capture both vehicle-team variables (including team composition and level of autonomy) and operator variables (including attention allocation strategies and situational awareness). In addition, the modeling system and method allow for varying of design variables so that results of different input variables may be determined.

Certain assumptions are made in accordance with the present system and method, which is referred to herein as a modeling system and method. The type of unmanned vehicle (UV) system that the present modeling system and method addresses is one where a single human operator is responsible for supervising a team of homogeneous or heterogeneous unmanned vehicles. Homogenous unmanned vehicles are unmanned vehicles that are of the same type and that perform the same task. Alternatively, heterogeneous unmanned vehicles are of different types or they perform different tasks (i.e., unmanned vehicles are considered heterogeneous even if they are of the same type, but have different missions). The human operator could be situated in a ground-based, sea-based, or airborne control station through which he/she is supervising the team of UVs. In addition, the operator is assumed to be acting in a supervisory control manner, although the exact role-allocation and the level of vehicle autonomy are system variables. Due to the supervisory control nature of the human-UV role allocation, it is assumed that the operator interacts with the vehicle at discrete points in time, meaning that there is no manual control or teleoperation of the vehicles. It should be noted, however, that the present system and method may be used with vehicles that are also capable of being manually controlled or controlled by teleoperation.

Functionality of the present modeling system 10 and method can be implemented in software, firmware, hardware, or a combination thereof. In a first exemplary embodiment, a portion of the modeling system 10 is implemented in software, as an executable program, and is executed by a special or general-purpose digital computer, such as a personal computer, workstation, minicomputer, or mainframe computer. The first exemplary embodiment of a general-purpose computer architecture that can implement the modeling system 10 is shown in FIG. 1.

Figure 1:
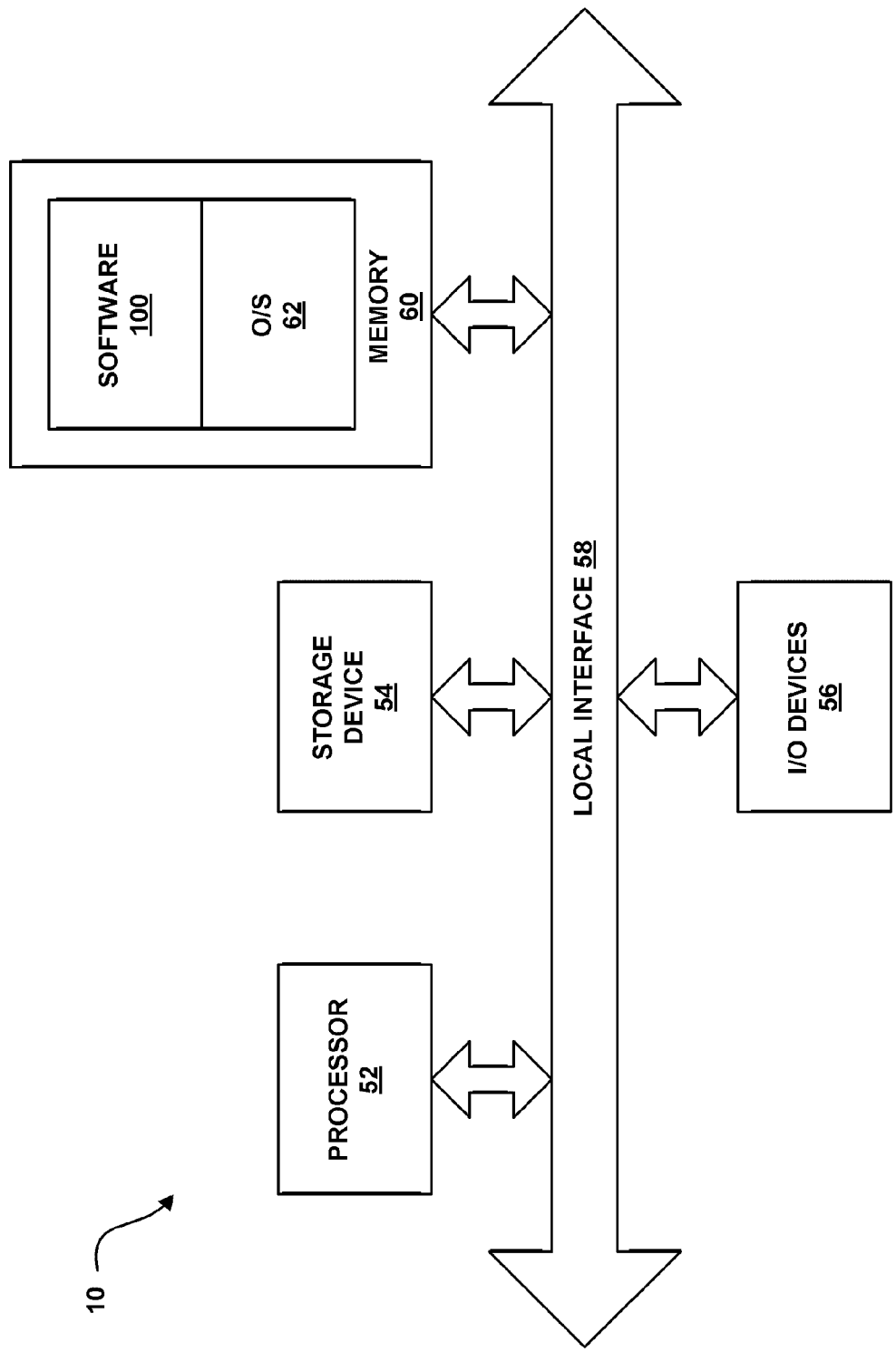
FIG. 1 is a schematic diagram illustrating a general-purpose computer architecture that can implement the present modeling system.

Generally, in terms of hardware architecture, as shown in FIG. 1, the computer 10 includes a processor 52, memory 60, storage device 54, and one or more input and/or output (I/O) devices 56 (or peripherals) that are communicatively coupled via a local interface 58. The local interface 58 can be, for example but not limited to, one or more buses or other wired or wireless connections, as is known in the art. The local interface 58 may have additional elements, which are omitted for simplicity, such as controllers, buffers (caches), drivers, repeaters, and receivers, to enable communications. Further, the local interface 58 may include address, control, and/or data connections to enable appropriate communications among the aforementioned components.

The processor 52 is a hardware device for executing software, particularly that stored in the memory 60. The processor 52 can be any custom made or commercially available processor, a central processing unit (CPU), an auxiliary processor among several processors associated with the computer 10, a semiconductor based microprocessor (in the form of a microchip or chip set), a macroprocessor, or generally any device for executing software instructions.

The memory 60 can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 60 may incorporate electronic, magnetic, optical, and/or other types of storage media. Note that the memory 60 can have a distributed architecture, where various components are situated remote from one another, but can be accessed by the processor 52.

The software 100 in the memory 60 may include one or more separate programs, each of which comprises an ordered listing of executable instructions for implementing logical functions of the modeling system 10, as described below. In the example of FIG. 1, the software 100 in the memory 60 defines the modeling system 10 functionality in accordance with the present invention. In addition, the memory 60 may contain an operating system (O/S) 62. The operating system 62 essentially controls the execution of computer programs and provides scheduling, input-output control, file and data management, memory management, and communication control and related services.

The modeling system 10 may be provided by a source program, executable program (object code), script, or any other entity containing a set of instructions to be performed. When a source program, then the program needs to be translated via a compiler, assembler, interpreter, or the like, which may or may not be included within the memory 60, so as to operate properly in connection with the O/S 62. Furthermore, the modeling system 10 can be written as (a) an object oriented programming language, which has classes of data and methods, or (b) a procedure programming language, which has routines, subroutines, and/or functions.

The I/O devices 56 may include input devices, for example but not limited to, a keyboard, mouse, scanner, microphone, etc. Furthermore, the I/O devices 56 may also include output devices, for example but not limited to, a printer, display, etc. Finally, the I/O devices 56 may further include devices that communicate via both inputs and outputs, for instance but not limited to, a modulator/demodulator (modem; for accessing another device, system, or network), a radio frequency (RF) or other transceiver, a telephonic interface, a bridge, a router, etc.

When the modeling system 10 is in operation, the processor 52 is configured to execute the software 100 stored within the memory 60, to communicate data to and from the memory 60, and to generally control operations of the computer 10 pursuant to the software 100. The software 100 and the O/S 62, in whole or in part, but typically the latter, are read by the processor 52, perhaps buffered within the processor 52, and then executed.

When the modeling system 10 is implemented in software, as is shown in FIG. 1, it should be noted that the modeling system 10 can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The modeling system 10 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the modeling system 10 is implemented in hardware, the modeling system 10 can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 2:
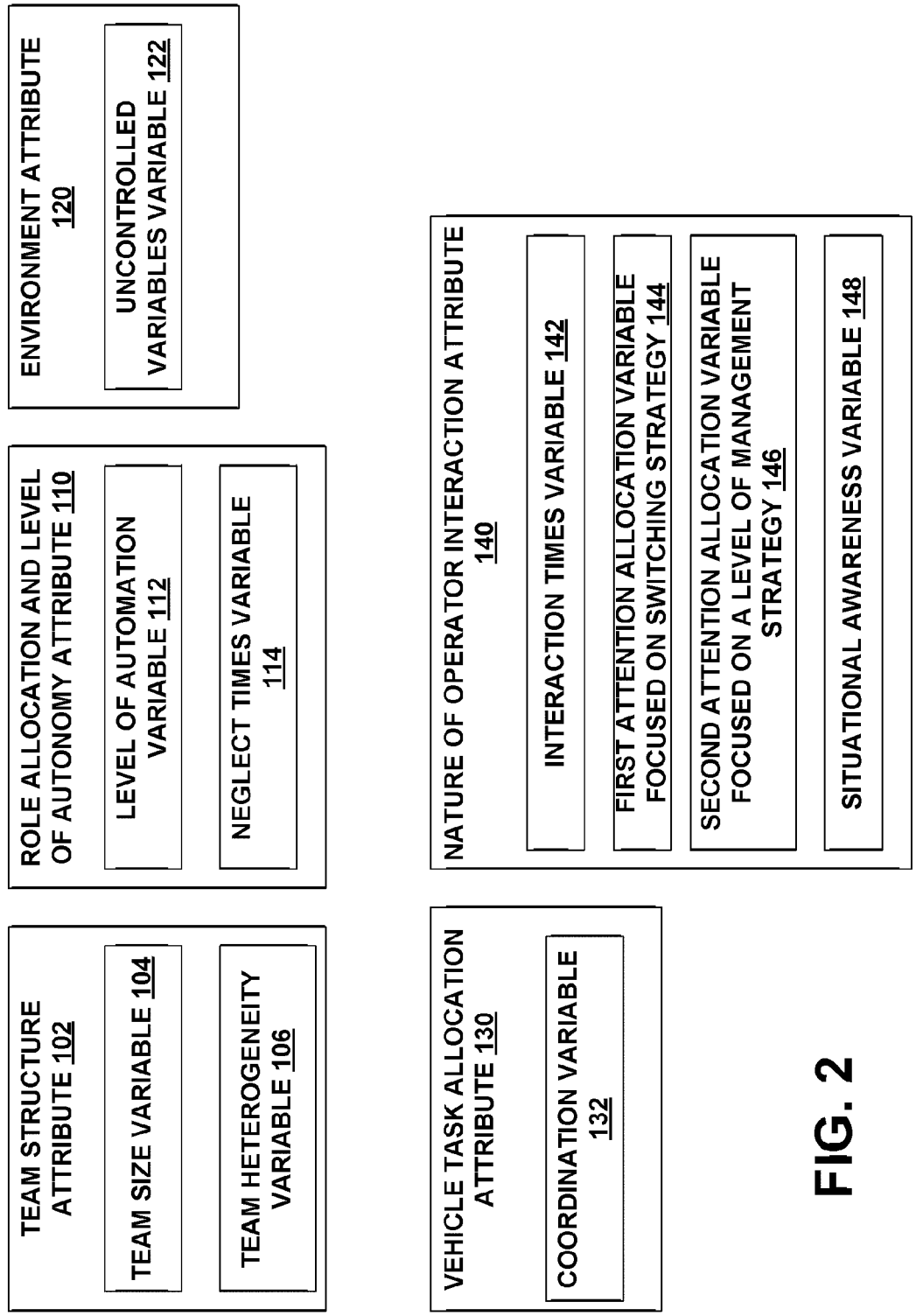
FIG. 2 is a schematic diagram illustrating attributes that are captured by the system of FIG. 1.

The present modeling system 10 allows for capturing of attributes. These attributes, which are captured by the software 100, are illustrated by FIG. 2. It should be noted that the attributes may be stored in the storage device 54. FIG. 2 is a block diagram illustrating attributes determined by the modeling system 10 and variables that construct each attribute. The following first lists the attributes and associated variables, and then describes each in detail.

Referring to FIG. 2, a first attribute is a team structure attribute 102, which is constructed of a team size variable 104 and a team heterogeneity variable 106. A second attribute is a role allocation and level of autonomy attribute 110, which is constructed of a level of automation variable 112 and a neglect times variable 114. A third attribute is an environment variable 120, which is constructed of an uncontrolled variables variable 122. A fourth attribute is a vehicle task allocation attribute 130, which is constructed of a coordination variable 132. A fifth attribute is a nature of operator interaction attribute 140, which is constructed of an interaction times variable 142, a first attention allocation variable 144 focused on switching strategy, a second attention allocation variable 146 focused on a level of management strategy, and a situational awareness variable 148.

Figure 3:
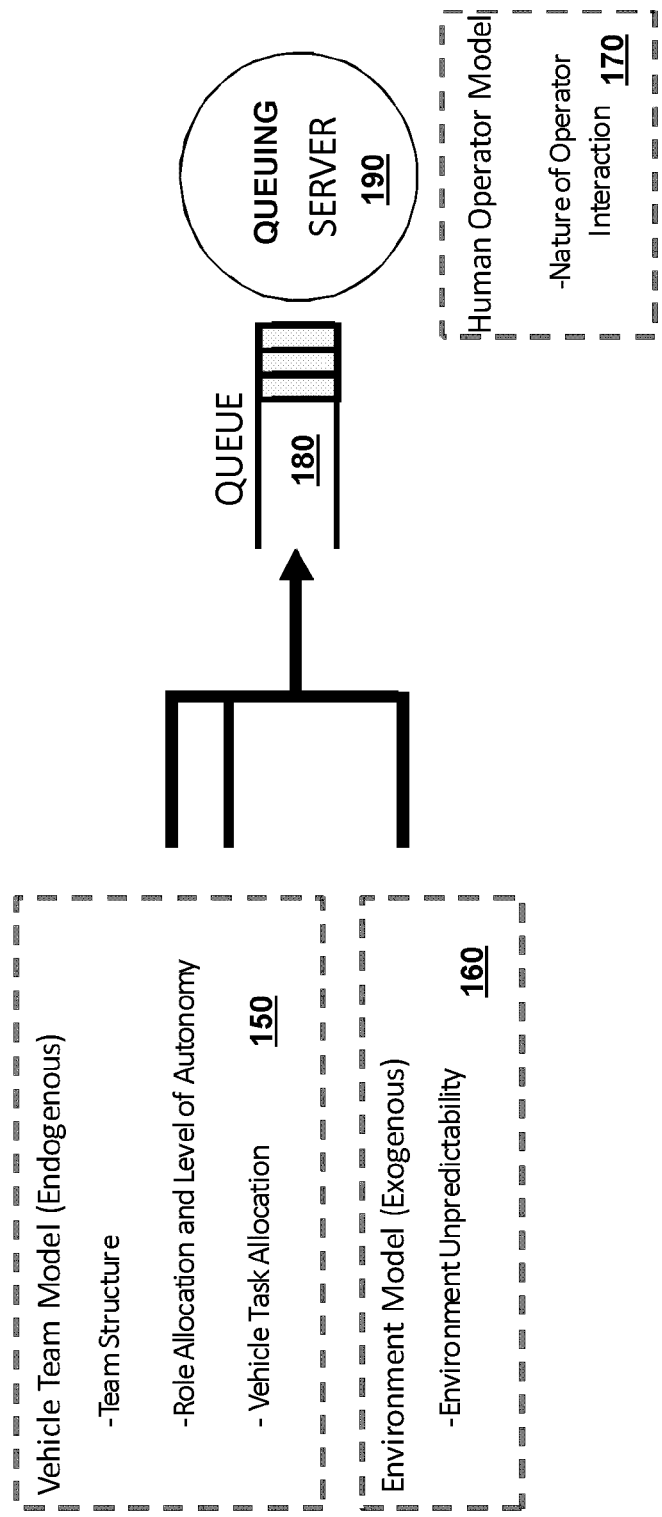
FIG. 3 is a schematic diagram providing a high level representation of interaction within the present modeling system.

FIG. 3 is a schematic diagram providing a high level representation of interaction within the present modeling system. As shown by FIG. 3, the modeling system 10 considers multiple models, including: a vehicle team model 150, which is endogenous since this model is derived from attributes that are associated with, and controlled by vehicles being simulated; an environmental model 160, which is exogenous since this model is derived from an attribute that is not associated with or controlled by the vehicles being simulated; and a human operator model 170. The vehicle team model contains the team structure attribute, the role allocation and level of autonomy attribute, and the vehicle task allocation attribute. In addition, the environmental model 160 contains the environment attribute, which is unpredictable. Further, the human operator model 170 contains the nature of operator interaction attribute. As shown by FIG. 3, instructions from the vehicle team model 150 and the environment model 160 are organized and controlled by a queue 180, prior to being received by a queuing server 190.

Prior to describing how the design variables associated with the attributes drive the present system and method, constructs of the present system are described below. In order to provide a modeling system that addresses the supervisory control tasks in unmanned vehicle systems, the present system focuses on representing average operator interaction that is context specific for human-unmanned vehicle systems. As a result, the present modeling system is based on a single server queue with multiple input streams. It should be noted that an operator can attend to only one complex event at a time so any events that arrive while the operator is busy will wait in the queue 180. The queuing policy is described in detail below.

There are four elements of the modeling system 10 that are provided by the software 100, namely, events in the system, arrival processes for these events, service processes for these events, and the queuing policy. The following describes each of the four elements. Referring first to events in the system, there are three general categories of events in the present multi-unmanned vehicle, single operator system. The first event category entails events that are unmanned vehicle-generated which expectedly occur as a result of the vehicle design. The second event category entails events that occur when the operator believes that interaction with system automation can increase performance, while the third event category is a function of environmental events.

Figure 4:
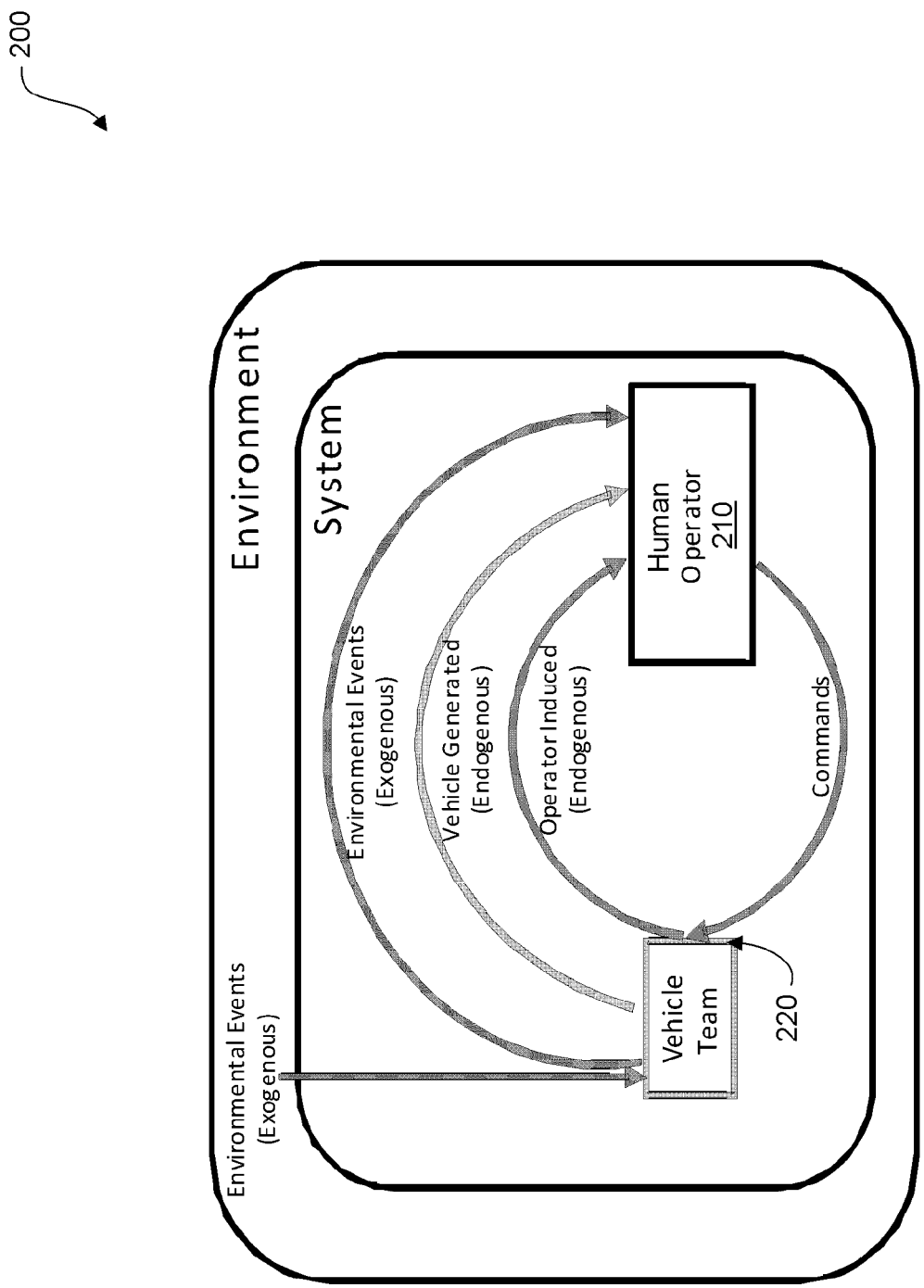
FIG. 4 is a schematic diagram illustrating the different event categories and the interaction with a human operator.

FIG. 4 is a schematic diagram 200 illustrating the different event categories and the interaction with a human operator. As shown by FIG. 4, the operator is expected to respond to environmental events, vehicle-generated events, and operator-induced events. The operator 210 is then capable of providing commands to a vehicle team 220 as a result of the occurrence of one or more of these categories of events.

Vehicle-generated events are endogenous events that arise expectedly due to the nature of a mission for the UV and due to pre-defined unmanned vehicle capabilities. An example of an endogenous unmanned vehicle-generated event is a ground vehicle that captures imagery, which results in an event that requires operator identification of the captured image. This is an expected task, and the human operator needs to use judgment and reasoning to verify the contents of the image. Such a situation is expected in the unmanned vehicle system since the inability of the automation to analyze imagery and the need for the operator to apply human judgment and reasoning are known obstacles in unmanned vehicle simulation.

Operator-induced events, which are also endogenous to the modeling system 10, address the ability of the human operator at any point of initiating a re-plan for an unmanned vehicle, even if the vehicle has not generated a task that requires human judgment and reasoning. This can occur when the human operator modifies an existing plan (re-planning) with the expectation that the intervention will lead to improved performance. For example, in the case of an unmanned vehicle that is travelling to a target, the operator could re-plan an automation-generated path in order to better meet a time-on-target restriction. Although both vehicle-generated and operator-induced events are endogenous to the system 10, the former are pushed on to the human operator by the system 10, whereas the latter are pulled by the human operator.

Environmental events are events that are exogenous to the system 10, arising unexpectedly due to environment unpredictability. Exogenous events create the need for human operator interaction, such as an emergent threat area that requires re-planning vehicle trajectories. This is an example of an emergent situation that a system designer cannot account for beforehand.

Referring to the second element of the modeling system 10, associated with each event type in the system 10 is an arrival process. Two types of arrival processes are important in modeling supervisory control of multiple heterogeneous unmanned vehicles, namely, independent and dependent arrival processes. Models of actual systems provided by the present modeling system 10 can contain any number of event types, which can each be represented by different arrival processes. Independent arrivals and dependent arrivals are further described below.

Referring first to independent arrivals, exogenous events, which stem from sources external to the mission (weather, target movements, etc.), are typically generated in a manner independent from operator handling of such events. For example, an emergent threat area, which can create a conflict in need of operator intervention, is generated independently of whether or not the previously occurring emergent threat area conflict was handled by the operator.

Since the arrival of an event is independent from the service of previously generated events, a basic queuing system arrival process is appropriate for modeling independent arrival processes. For such an arrival process, the defining attribute is a random variable, X, representing the inter-arrival time between events. A probability density function, $f_X(x)$, can be used to define the distribution of inter-arrival times. In a UV system with m exogenous event types, the arrival processes can be modeled such that for each exogenous event type i, where $1 \leq i \leq m$, the probability density function $f_{X_i}(x)$ of the continuous random variable $X_i$ is defined, where $X_i$ represents the inter-arrival time between events of type i. The resultant arrival rate for independent event type i is represented by equation 1 (Eq. 1), which is shown below.

$$\lambda_i^{independent} = \frac{1}{E[X_i]}, \text{ where } E[X_i] \neq 0 \tag{1}$$

Since endogenous events associated with a specific vehicle are generally preconditioned on some other event being attended to first, these arrivals are generally dependent on the servicing of previously generated events. The dependency can be on (a) the last generated event of the same type being serviced first (in the case where only one event can exist at any point in time), or (b) an event of some other type being serviced first (in the case where the occurrence of an event is triggered by some other event being serviced first). An example of (a) is the need for the human operator to analyze captured images. Once such an event is generated, the operator needs to attend to the event first before a second "analyze image" event can be generated by the same vehicle. In this case, the arrival of a specific event type is correlated with the time at which the last arriving event was serviced. An example of (b) is the arrival process of events that require an unmanned vehicle to be re-assigned to a new goal. Assuming in such a case that goal re-assignment occurs following the completion of target acquisition at the current goal, the arrival process for the re-assignment event is dependent on the target acquisition event being serviced first. In this case, an event representing goal re-assignment is generated once an event representing target acquisition has been serviced.

In both of these cases (i.e., (a) and (b)), modeling the endogenous event arrival process differs from the method by which exogenous independent arrival processes are modeled. In order to model dependent arrival processes, a closed queuing network paradigm can be used to model arrivals for the event type in question. It should be noted that other methods can also be used to model arrivals for the event type in question. In a closed queuing network paradigm, the population of events is finite. At any point in time, a single event is either waiting in a queue of one of the simulated servers or is being serviced. Once an event is serviced by one of the simulated servers, the event proceeds to the next simulated server in the network.

Figure 5:
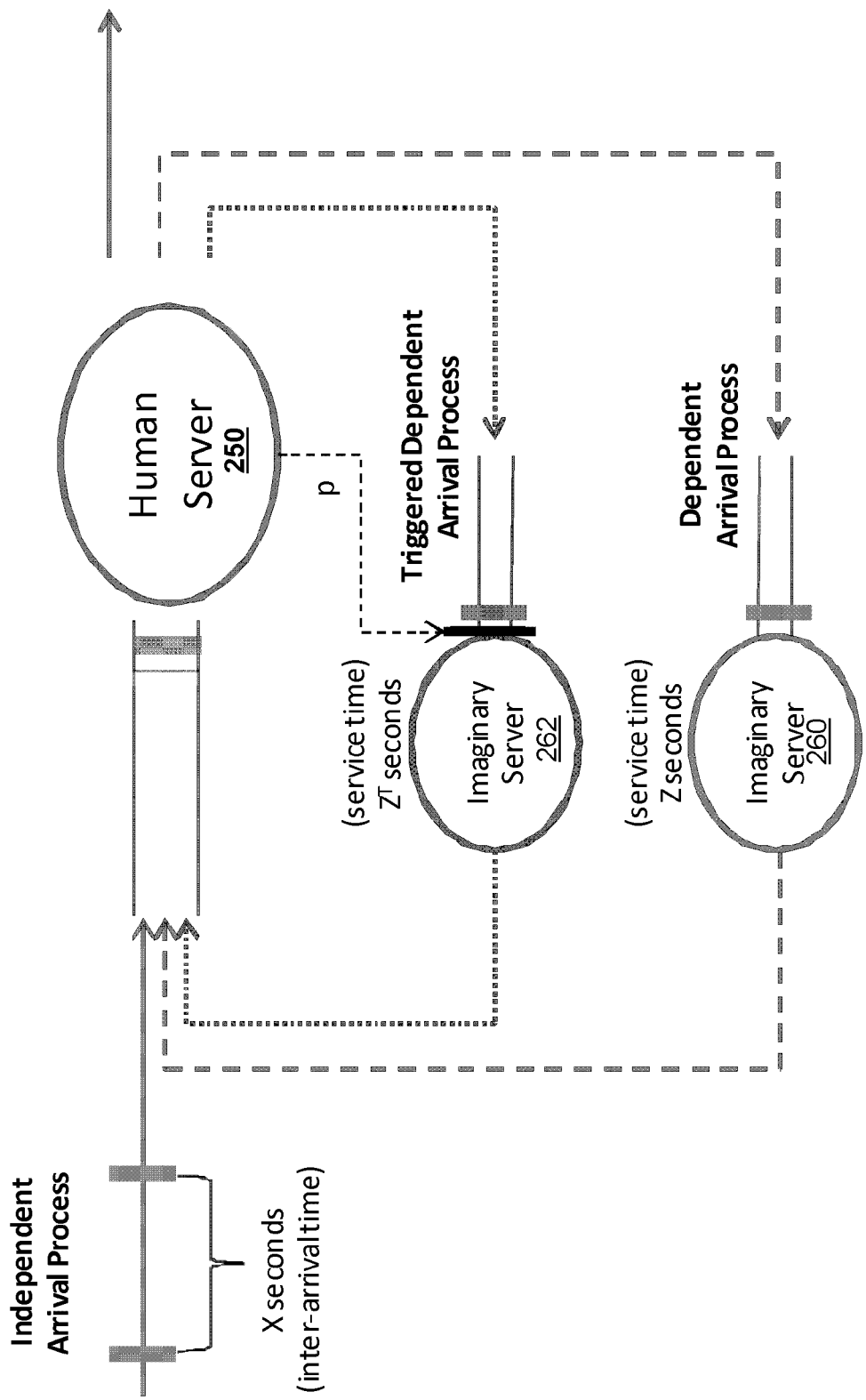
FIG. 5 is a schematic diagram illustrating different arrival process types arriving to simulated servers provided by the present modeling system.

FIG. 5 is a schematic diagram illustrating different arrival process types arriving to simulated servers provided by the present modeling system 10. To model the case where arrivals are dependent on events of the same type being serviced first, the dependency in arrivals can be achieved by using a queuing network with a population of one event and two simulated servers, as indicated by the subsystem with dashed lines in FIG. 5. As shown by FIG. 5, one simulated server represents the actual human server 250 in the modeling system 10, while the other simulated server is a first imaginary server 260 whose role is to capture the process that takes place between the end of an endogenous event's service and the next time the endogenous event occurs. For example, once the dependent "analyze image" event is serviced, the vehicle will need to travel to the next goal before another "analyze image" event will be generated. Modeling the arrival process in this manner results in a single event in the modeling system 10 that arrives in the queue of the operator once operator interaction is needed.

While endogenous events in the sub-system are waiting or undergoing service, no other event can be generated. Once an endogenous event is serviced, the UV will no longer need attention for the event in question, and this is captured through the event proceeding to the first imaginary server 260. The service time for the first imaginary server 260 is a random variable, Z, which represents the time between the completion of a service for this dependent event and the next event of the same type arriving to the queue of the human operator. Since Zs represent the time an unmanned vehicle can operate without human intervention for a specific event type, they effectively represent degrees of autonomy. This is similar to the concept of neglect time (the time that a vehicle can operator without human intervention or interaction), except that in this case, the neglect time is for a specific event and not for the whole vehicle (i.e., other events associated with the same vehicle can still be generated while a specific event type is being neglected).

In the case where arrivals are dependent on an event of a different type being serviced first, blocking is used by the present system 10. Blocking is used in queuing networks to model the temporary stop of flow of events through a queue, nominally due to another queue having reached its capacity limitation. In the present modeling system 10 the concept of blocking is used in order to stop the flow of the dependent events through the queue of a second imaginary server 262, as shown by the sub-system with dotted lines in FIG. 5. In order to model the triggered dependent process, the triggering event type needs to be defined first. Having identified the triggering event type, the arrival process is modeled such that servicing of a triggering event causes the removal of the block and therefore allows the dependent event to arrive to the queue of the operator some time later. Since the triggering of a dependent event arrival is stochastic, either occurring or not, a Bernoulli distribution with success probability p can be associated with the triggering process. In this second type of dependent arrival, the variable of concern is the time between the completion of a service for the triggering event and the arrival of the dependent event to the queue of the operator. This is captured through a random variable $Z^T$, which represents the service time for the second imaginary server 262.

In both of the above dependent arrival cases, the arrival processes can be described by the probability density functions $f_Z(z)$ and $f_{Z^T}(z^T)$, depending on the type of dependent arrival process. In an unmanned vehicle scenario with n vehicles, the dependent arrival processes can be modeled such that for each vehicle i, where 1≤i≤n, and for each endogenous event j, where 1≤j≤g(i), where g(i) is the total number of dependent event types associated with vehicle i, the probability density function $f_{Z_{ij}}(z)$ is defined, where $Z_{ij}$ is the time between an event of type j being serviced and the arrival of the next event of type j. When the dependent event is of the triggered type, the probability density function that needs to be defined is $f_{Z^T_{ij}}(z^T)$ where $Z^T_{ij}$ is the time between the servicing of the triggering event and the arrival of the event of type j to the queue of the operator.

When the time between the service of an event and the arrival of the dependent event for a specific event type depends on the state of the simulated system being modeled (i.e., status of individual unmanned vehicles), a family of random variables $\{Z(s), s \in \Sigma\}$ indexed by the parameter s where s is the state of the simulated system being modeled varying over a set $\Sigma$ representing all possible states, can be used to describe the event type. A probability density function is then defined for each random variable in the set. The method by which the unmanned vehicle state can change is referred to as service impact, which is described below.

Modeling certain systems could require other variations of arrival processes, such as a process where events arrive independently from each other, but where there is a limit to the maximum number of events that could be in the system at any point in time. Techniques such as balking and reneging can be used to capture variations in arrival processes. In the case of balking, the arriving event refuses to enter the queue for some predefined reason, while in the case of reneging, the event leaves the queue after having entered the queue.

Having defined the different arrival processes required to capture the event categories previously identified, the following describes the method provided by the present system 10 by which lack of operator situational awareness (SA) can be captured by the present modeling system 10. This is done by modifying the previously defined arrival processes to account for any wait times incurred due to loss of operator situational awareness.

Situational awareness is defined as the combination of perception of elements in the environment, the comprehension of their meaning, and the projection of their status in the future. Operator situational awareness captures the ability of operators to make effective choices as a function of information processing efficiency. As such, situational awareness can significantly influence human behavior and hence, human-unmanned vehicle system performance. Since situational awareness is dynamic, it can influence operator responses over time and as a result, can dynamically impact supervisory control performance.

Operator situational awareness impacts the times that vehicles have to wait for operator attention. In addition to a vehicle having to wait while the operator is busy attending to other vehicles, vehicles could also experience wait times due to operator loss of situational awareness (WTSA). WTSAs occur when operators are not aware of vehicles requiring their attention. WTSA can account for the largest part of vehicle wait time, and significantly reduce the overall number of vehicles that a single operator could control. Operator situational awareness has been shown to have a significant impact on the nature of unmanned vehicle operator attention allocation and overall system performance, and it is therefore beneficial that the present system and method addresses situational awareness in a model of supervisory control of heterogeneous unmanned vehicles.

In order to capture WTSA, the present system and method addresses a hypothetical relationship between operator utilization and WTSA that is based on the following two relationships. The first relationship is one based on the classic Yerkes-Dodson inverted U-shaped function. It is known that, all else equal, both low and high operator arousal are associated with lower performance, with the former being due to human complacency, while the latter being a result of the human's inability to handle excess workload. It is this relationship that the present system and method builds on, such that the arousal level is represented by increasing operator utilization. Operator utilization, p, is defined as the percent busy time, or the ratio of the total time the operator is engaged in tasks, i.e. servicing events, to the total time of the mission.

The second relationship is between situational awareness and performance. Previous work has shown that operator situational awareness can be measured as a function of mission performance. Assuming the following abbreviations, o for performance, and s for situational awareness, the functions f and g can be used to describe the above two relationships, as shown by equations 2 and 3 below.

$$f \times \rho \rightarrow o \qquad (Eq.\ 2)$$

$$g \times o \rightarrow s \qquad (Eq.\ 3)$$

It should be noted that the relationship proposed for relating operator utilization to situational awareness is based on the law of transitivity, as shown by equation 4 below.

$$\gamma \times \rho \rightarrow s \qquad (Eq.\ 4)$$

Figure 6:
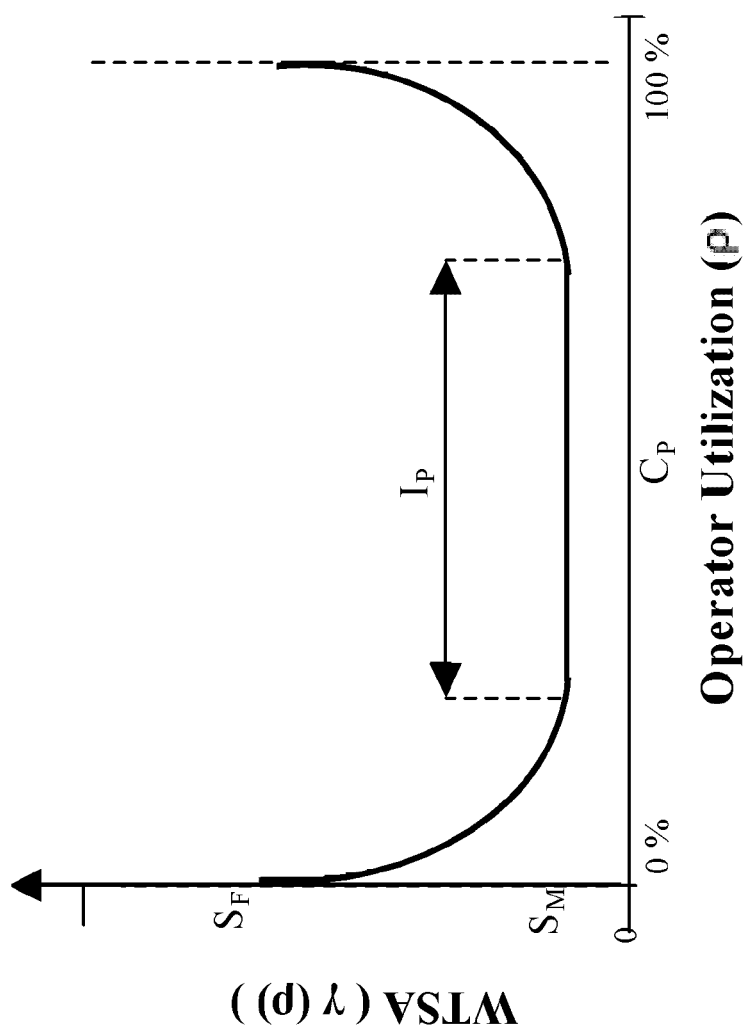
FIG. 6 is a schematic diagram providing a graph further illustrating the parabolic function between WTSA ($\gamma(\mu)$) and operator utilization ($\rho$) that is concave upwards.

The present modeling system 10 therefore builds on an assumption that situational awareness is related to operator utilization through a functional form, $\gamma$. The relationship provided by the present modeling system is a parabolic function between WTSA ($\gamma(\rho)$) and operator utilization ($\rho$) that is concave upwards, such that WTSA is high at both low and high operator utilization. FIG. 6 is a schematic diagram providing a graph further illustrating the parabolic function between WTSA ($\gamma(\rho)$) and operator utilization ($\rho$) that is concave upwards. As shown by FIG. 6, when operators are under high levels of utilization, it is assumed that they can be too busy to accumulate the information that is required to build situational awareness. At the same time, when operators are under-utilized, it is presumed that due to a low level of arousal and complacency, they could overlook information from the environment, which would also lead to low situational awareness. Both of these lead to higher WTSA at the extremities of the utilization scale.

Referring to FIG. 6, the size of the penalties at different utilization levels is dependent on the exact shape of the $\gamma$ curve, which is defined by four different parameters. The first of these parameters, $S_M$, is the minimum penalty due to loss of situational awareness. The second parameter is the point about which the curve is centered ($C_P$), which represents the utilization level where the situational awareness penalty is at a minimum. The third parameter, $I_P$, is the width of the interval around $C_P$, which also has minimum situational awareness penalties (if $I_P$ is zero, then the penalty is at a minimum only at $C_P$ utilization and the $\gamma$ curve is a parabolic curve). Finally, the fourth parameter, $S_F$, is a scaling parameter that affects the magnitude of the penalties that can be incurred. In the case of a symmetric curve, $\gamma$ takes on the value $S_F$ at the 0% and 100% utilization levels.

Using the functional form between WTSA and operator utilization, $\gamma$, the arrival process of dependent events is modified to account for loss of operator situation awareness. Introducing a modified arrival process is to build upon the previous description that modeled event arrivals without taking into account delays due to loss of situational awareness. The modified arrival process is described by a probabilistic distribution over a random variable ($Z'$ or $Z^{T'}$) that is a function of two main components: a) the random variable associated with the dependent arrival process and, b) a penalty due to loss of operator situational awareness. This is shown for both types of dependent arrival processes in equations 5 and 6 below $$z'=z+\gamma(\rho) \qquad (Eq. 5)$$

$$z^{T'}=z^T+\gamma(\rho) \qquad (Eq. 6)$$

The first term in equation 5, $z$, is a realization of the random variable Z defined previously, that describes the time between one service and the next arrival. Similarly, the first term in equation 6, $z^T$, is a realization of the random variable $Z^T$ defined previously, that describes the time between the service of the triggering event and the arrival of the dependent event in question. Since the generation of a task does not necessarily imply that the operator notices the generated task, the second term in equations 5 and 6, $\gamma(\rho)$, represents a penalty due to operator loss of situational awareness. $\gamma$, which is a function of operator utilization, $\rho$, takes on some minimum value when the operator has complete situational awareness and higher values when the operator has degraded situational awareness. As was defined earlier, $\rho$ is the ratio of the total time the operator is engaged in tasks, such as servicing events, to the total time elapsed.

Since it is required to calculate the penalty $\gamma$ and therefore $\rho$ for each dependent arrival throughout the mission, the time period over which operator utilization is calculated can span, at most, the total elapsed time. The exact size of the time window used for calculating utilization, as well as the exact functional form $\gamma$ that relates WTSA to $\rho$ are design parameters which are a function of interface properties and operator training. In addition, to defining probability density functions associated with independent and dependent arrival processes, the function $\gamma(\rho)$ should be defined over all $\rho$, where $0 \leq \rho \leq 100$.

Referring to the third element of the modeling system 10, associated with each event type in the system 10 is a service process, also known as the time necessary to deal with the event. The length of time it takes the operator to deal with an event, interaction time (IT) or Y', is a random variable that can be modeled using a service time distribution. The random variable is a function of two main components: a) the random variable describing the times for which operators need to service tasks; and b) the random variable describing the wait times due to interaction (WTI), as shown by equation 7.

$$y'=y+wti \qquad (Eq. 7)$$

The first term in equation 7, $y$, is the realization of the random variable Y that describes the length of time for which the operator must interact with the arriving event. The probability density function describing Y, $f_Y(y)$, captures the variability of performance between different operators, as well as the variability in the performance of a single operator. The second term in equation 7, wti, is the realization of the random variable WTI that represents the wait times due to interaction that arise when servicing the arriving event. Wait times due to interaction can be due to any decision making, context switching times incurred prior to servicing the arriving event, or the operator having to wait on the modeling system for more information. WTIs can vary per event type, due to the dependency of decision making times and switching times on the particular event type. The effect of these WTIs is to increase Y'.

The service processes for endogenous event types can be modeled such that for each vehicle i, where $1 \leq i \leq n$, and for each event j, where $1 \leq j \leq g(i)$, where g(i) is the total number of dependent event types associated with vehicle i, the probability density functions $f_{Y_{ij}}(y)$ and $f_{WTI_{ij}}(wti)$ are defined, where $Y_{ij}$ and $WTI_{ij}$ are random variables representing the service time and the wait time due to interaction associated with endogenous event type j. The service processes for exogenous event types can be defined similarly such that for each exogenous event type i, where $1 \leq i \leq m$, the probability density functions $f_{Y_i}(y)$ and $f_{WTI_i}(wti)$ are defined, where $Y_i$ and $WTI_i$ are random variables representing the service time and the wait time due to interaction associated with exogenous event type i.

In addition to a service process being defined by service times, it is also important to consider the impact of the serviced event. An important feature that the present modeling system relies on allows the impact of an event service to be taken into account such that the system state is updated. The concept of service impact can be used for several purposes, the most important of which is interaction between different event types. Event interaction can take place by having one event type change a system state variable, while having the arrival process of a second event type depend on that same state variable. Event interaction is important, especially for endogenous event types that could have dependent arrival processes where the associated random variable is a function of the system state.

Two types of event interaction are provided for by the present modeling system 10 for modeling supervisory control of multiple unmanned vehicles. First, an event can modify the arrival process of a second event type permanently. For example, servicing an event that represents a vehicle path intersecting a threat area in an untimely manner can lead to the vehicle involved to be damaged. The effect of this could be to slow down the vehicle that would modify the arrival process of subsequent events. Second, an event can modify the arrival process of a second type temporarily, such as the arrival process of just the next arriving event. This could occur, for example, when an operator decides to re-plan the vehicle destination in order to reach a target in shorter time. The effect of this would be to speed up the arrival of just the next scheduled event associated with arrival of the vehicle to targets. Other variations of interaction between event types can be modeled in this manner.

Referring to the fourth element of the modeling system 10, associated with each event type in the system 10 is the queuing policy. The queuing policy determines the order by which multiple events that are waiting in the queue are serviced. The present modeling system 10 uses the flexibility of queuing policies to capture variations in operator switching strategies. Examples of switching strategies that can be modeled include the first-in-first-out (FIFO) queuing scheme as well as the highest attribute first (HAF) strategy. The HAF strategy is similar to a preemptive priority scheme in that high priority events are serviced first except that there is no pre-emption. Therefore if an event is generated with a priority higher than any of the events already in the modeling system 10, it will be moved to the front of the queue but will not preempt a lower priority vehicle that is already being serviced. The queuing policy will then dictate the method by which the queue is handled.

Figure 7:
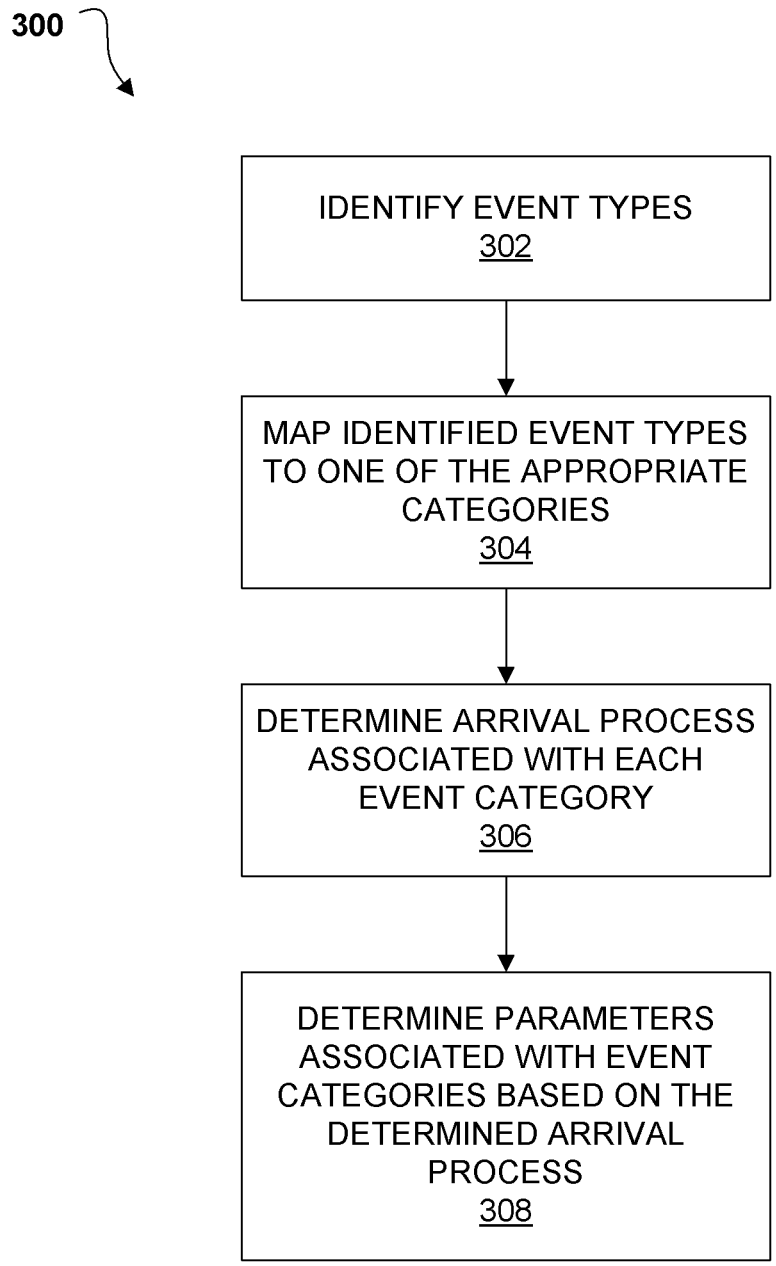
FIG. 7 is a flow chart that summarizes the four elements of the modeling system, namely, events in the system, arrival processes for these events, service processes for these events, and the queuing policy.

FIG. 7 is a flow chart 300 that summarizes the four elements of the modeling system 10, namely, events in the system, arrival processes for these events, service processes for these events, and the queuing policy. It should be noted that any process descriptions or blocks in flow charts should be understood as representing modules, segments, portions of code, or steps that include one or more instructions for implementing specific logical functions in the process, and alternate implementations are included within the scope of the present invention in which functions may be executed out of order from that shown or discussed, including substantially concurrently or in reverse order, depending on the functionality involved, as would be understood by those reasonably skilled in the art of the present invention.

Referring to FIG. 7, event types in the modeling system 10 are identified (block 302). The event types are then mapped to one of the appropriate event categories (block 304). Thereafter, the arrival process associated with each event category is determined (block 306). As shown by block 308, different parameters associated with event categories are determined, based on the determined arrival process. Table 1, as shown below, summarizes these parameters.

TABLE 1

| Process | Parameter of concern | Parameter notation | Distribution |
|---|---|---|---|
| Independent Arrival | Inter-arrival time between events | X | $f_X(x)$ |
| Dependent Arrival | Time between service of last generated event and arrival of next event or Time between service of triggering event and arrival of event | Z or $Z^T$ | $f_Z(z)$ or $f_Z T(z^T)$ |
| Independent/ Dependent Service | Time required for servicing event | Y | $f_Y(y)$ |

The following further describes how the attributes of FIG. 2, that define the modeling system 10, through their associated design variables, map to the different model constructs previously described. Referring to the first attribute, namely the team structure attribute, the team structure attribute is represented in the present modeling system through the team size and team heterogeneity variables. The team size variable is captured in the number of vehicles modeled through endogenous event types. Due to the multiple input stream architecture, the modeling technique is able to capture the level of heterogeneity variable. A heterogeneous unmanned vehicle team is one where in a team of size n, there exists at least one vehicle, α, and an event type, j, where $f_{Z_{aj}}(z) \neq f_{Z_{bj}}(z)$ or $f_{Y_{aj}}(y) \neq f_{Y_{bj}}(y)$ where 1<a, b<n and a≠b. Heterogeneity can be classified as existing strictly in service processes, in arrival processes, in event types associated with the vehicles, or any combination of these.

Referring to the second attribute, namely the role allocation and level of autonomy attribute, the role allocation and level of autonomy attribute is represented in the modeling system 10 through the level of automation, and neglect times variables. The level of automation variable is captured through the number and types of endogenous event types represented in the system 10. Since any event in the modeling system 10 requires human input when it arrives to the human server, defining the events that will be captured in the simulated model is essentially capturing the role of the human operator and hence the role of the vehicles. Neglect times are captured in the present modeling system 10 through the probability density functions, $f_Z(z)$ or $f_{Z^T}(z^T)$, associated with each endogenous event type. The type, mean, and variance of the density functions can be varied in order to capture alternative neglect time profiles.

Referring to the third attribute, namely the environment variable, the environment variable attribute is represented in the modeling system 10 through the uncontrolled variables that can affect the simulated system. The uncontrolled variables can be captured by the present modeling system 10 through an identification of exogenous event types and associating each event type a probability density function, $f_X(x)$. The type, mean, and variance of the density functions can be varied in order to capture the unpredictability of the environment and can be used to test the robustness of the measured metrics to unexpected events, thereby defining performance boundaries as opposed to exact performance predictions.

Referring to the fourth attribute, namely the vehicle task allocation attribute, the vehicle task allocation attribute is represented in the modeling system 10 through the level of coordination variable. Since the random variables representing the time between event servicing and the next arrival of dependent events can depend on the vehicle state, different levels of event interaction can be captured by varying the amount and type of dependency. The ability of the modeling system 10 to capture event interaction allows the modeling system 10 to capture coordination between different event types.

Referring to the fifth attribute, namely the nature of operator interaction attribute, the nature of operator interaction attribute is represented in the modeling system 10 through interaction times, attention allocation strategies, and situational awareness variables. Interaction time variables are captured in the present modeling system 10 through the probability density functions, $f_Y(y)$, associated with event servicing. The modeling system 10 captures two attention allocation strategies, namely, a switching strategy and an operator level of management strategy. In order to model the switching strategy of the operator, the type of queue can be varied to represent different switching strategies. For example, priority-based switching strategies can be captured through the queuing policy as described previously.

The operator level of management strategy, which is the rate at which operator-induced events arrive to the simulated system, is a function of the amount of operator re-planning. The management strategy represents a more global scheme by which the operator distributes his/her attention across the different vehicle events. Since the modeling system supports endogenous events that are both vehicle-generated and operator-induced, the rate at which operator-induced events arrive to the simulated system depends on the desire of the operator to interact with the vehicles beyond unavoidable vehicle-generated events. This can be captured by varying the probability density functions, $f_Z(z)$ or $f_{Z^T}(z^T)$, or the triggering Bernoulli probability, p, associated with operator-induced events.

Finally, the situational awareness variable is captured in the modeling system 10 through the $\gamma(\rho)$ function, which defines wait times due to loss of situational awareness. While the service and modified arrival process models account for variation in human performance through their stochastic representation of operator performance, other variables are likely to influence individual operator performance such as training and fatigue, which could also be included in this model as similar probabilistic inputs.

The following describes outputs provided by the present modeling system and method. Specifically, in addition to supporting the design of unmanned vehicle systems in varying design variables, the present system and method allows for the measurement of several output variables. These variables include those that arise naturally in DES-based models, as well as specific user-defined metrics that the present system and method allows a designer to capture. Outputs of the present modeling system and method include discrete event simulation metrics and mission-specific metrics. Included in discrete event simulation metrics are vehicle wait times and operator utilization. Vehicle wait times are the times that the unmanned vehicle spends waiting for some required operator intervention, such as, for example, when they are at one target and need to be told when to progress to the next target. In addition, operator utilization is the percent busy time or the time that the operator is engaged in directed tasking divided by the total mission. Vehicle planning time, communication times, and mission-related tasks, like image searching, all are directed tasks. Monitoring time, or the time the operator has no specific tasking, counts as free time.

The mission-specific metrics include the number of a specific task completed, the rate at which the tasks are completed, the amount of time that an event had to wait before receiving attention, and performance metrics. Examples of determining performance metrics may include first punctually servicing an event that entails a visual task resulting in a performance metric being positively incremented, and then servicing the visual task with a slight delay, which might result in a smaller reward in terms of performance. The mission specific metrics are beneficial since they can reduce excessive experimental costs by allowing the present system and method to be used with similar output fidelity.

It should be noted that attributes and variables in the present system and method may be provided to the modeling system 10 in different forms. As an example, a user may enter values for attributes and variables for simulating by the modeling system 10. In addition, attributes and variables can be provided to the present modeling system by obtaining real feedback from actual human users of the modeling system through real-time simulation, where a human user acts as the simulated human users within the modeling system. Such real-time simulation may take place through an environment such as, but not limited to, a simulation video game.

In addition to the abovementioned human operator service time determination, the present system and method is capable of modeling how long an operator interacts with a vehicle and accounting for when an operator chooses to interact with the wrong unmanned vehicle. The period that the operator interacts with the vehicle and the period that the operator chooses to interact with the wrong unmanned vehicle is referred to as an error rate. Such error rates may also ne modeled as attributes of the present system and method.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A system for providing simulation for supervisory control of an unmanned vehicle system, comprising:
   a memory; and
   a processor configured by the memory to perform the steps of:
   mathematically and stochastically simulating events in the unmanned vehicle system;
   mathematically simulating arrival processes for the events in the system via a single server queue with a plurality of input streams; and
   mathematically simulating how long a human operator takes to respond to the mathematically simulated events in the system, where the time that the human operator takes to respond to a mathematically simulated event is referred to as a service time,
   wherein the system stochastically models human operator involvement in the unmanned vehicle system, and a model for processing an endogenous event arrival differs from a model for processing an exogenous event arrival.

2. The system of claim 1, wherein the processor is further configured by the memory to perform the step of modifying the mathematically simulated arrival processes to account for wait times due to operator loss of situational awareness.

3. The system of claim 1, where the mathematically simulated events in the system are selected from the group consisting of events that are unmanned vehicle-generated, events that occur when the operator elects to interact with the system to increase performance, and events that are a function of environmental events.

4. The system of claim 1, wherein when arrival processes are dependent on an event of a different type being serviced first, blocking is used to model a temporary stop of flow of the events through the queue.

5. The system of claim 1, wherein there is a limit to a maximum number of events that could be in the system at any point in time.

6. The system of claim 1, wherein the step of mathematically simulating arrival processes for the events in the system further comprises mathematically simulating a first event modifying the simulated arrival process of a second event type permanently.

7. The system of claim 1, wherein the step of mathematically simulating arrival processes for the events in the system further comprises mathematically simulating a first event modifying the simulated arrival process of a second event type temporarily.

8. The system of claim 1, wherein the processor is further configured by the memory to perform the step of prioritizing the events to be handled by the human operator.

9. The system of claim 1, wherein the processor is further configured by the memory to perform the step of mathematically simulating at least one variable and at least one attribute associated with the system.

10. The system of claim 9, wherein the at least one variable includes a number of unmanned vehicles.

11. The system of claim 9, wherein the at least one attribute is selected from the group consisting of a team structure attribute, a role allocation and level of autonomy attribute, an environment attribute, a vehicle task allocation attribute, and a nature of operator interaction attribute.

12. The system of claim 11, wherein the team structure attribute contains a team size variable and a team heterogeneity variable.

13. The system of claim 11, wherein the role allocation and level of autonomy attribute contains a level of autonomy variable and a neglect times variable.

14. The system of claim 11, wherein the environment attribute contains an uncontrolled variable.

15. The system of claim 11, wherein the vehicle task allocation attribute contains a coordination variable.

16. The system of claim 12, wherein the nature of operator interaction attribute contains an interaction times variable, a first attention allocation variable focused on switching strategy, a second attention allocation variable focused on a level of management strategy, and a situational awareness variable.

17. The system of claim 11, wherein the at least one variable and/or the at least one attribute is obtained by receiving feedback from a human user of the modeling system through real-time simulation.

18. The system of claim 1, wherein the step of mathematically simulating how long a human operator takes to respond to the simulated events in the system, further comprises mathematically simulating how long the human operator takes to respond to simulated events in the system and associated error rates.

19. The system of claim 1, wherein the simulated unmanned vehicle system comprises a heterogeneous set of unmanned vehicles.

* * * * *